US010249668B2

(12) United States Patent
Bakowski Holtryd et al.

(10) Patent No.: US 10,249,668 B2
(45) Date of Patent: *Apr. 2, 2019

(54) X-RAY SENSOR, X-RAY DETECTOR SYSTEM AND X-RAY IMAGING SYSTEM

(71) Applicant: Prismatic Sensor AB, Stockholm (SE)

(72) Inventors: Mietek Bakowski Holtryd, Stillingson (SE); Mats Danielsson, Taby (SE); Cheng Xu, Taby (SE)

(73) Assignee: PRISMATIC SENSORS AB, Stockholm (SE)

(*) Notice: Subject to any disclaimer, the term of this patent is extended or adjusted under 35 U.S.C. 154(b) by 0 days.

This patent is subject to a terminal disclaimer.

(21) Appl. No.: 15/946,052

(22) Filed: Apr. 5, 2018

(65) Prior Publication Data

US 2018/0337204 A1    Nov. 22, 2018

Related U.S. Application Data

(62) Division of application No. 15/597,925, filed on May 17, 2017.

(51) Int. Cl.
 *H01L 27/146* (2006.01)
(52) U.S. Cl.
 CPC ...... *H01L 27/1463* (2013.01); *H01L 27/1462* (2013.01); *H01L 27/14658* (2013.01)
(58) Field of Classification Search
 CPC ............. H01L 27/1463; H01L 27/1462; H01L 27/14658
 USPC ........................................................ 257/429
 See application file for complete search history.

(56) References Cited

U.S. PATENT DOCUMENTS

| 4,377,816 | A | 3/1983 | Sittig |
| 6,072,224 | A | 6/2000 | Tyson et al. |
| 8,093,624 | B1 | 1/2012 | Renzi et al. |
| 9,087,755 | B2 | 7/2015 | Frach |
| 2002/0121664 | A1 | 9/2002 | Priefert |
| 2013/0248886 | A1 | 9/2013 | Kitagawa |

FOREIGN PATENT DOCUMENTS

DE    102005029263    1/2007

OTHER PUBLICATIONS

U.S. Appl. No. 15/597,925.*
International Search Report for Application No. PCT/SE2018/050320, dated May 30, 2018.
Bosma, M.J. et al., "Edgeless silicon sensors for Medipix-based large-area X-ray imaging detectors," Journal of Instrumentation, vol. 6, C01035 (2011).

(Continued)

*Primary Examiner* — Caleen O Sullivan
(74) *Attorney, Agent, or Firm* — Young & Thompson

(57) ABSTRACT

There is provided an x-ray sensor (21) comprising an active detector region including a plurality of detector diodes (22) at a first side of the sensor, and a common junction termination (23) at a second opposite side of the sensor. Normally, this implies that the junction termination (23) is moved from the top side where the active detector area is located to the bottom side of the sensor, allowing for full utilization of the active detector area at the top side with detector diodes to the very edge of the sensor.

8 Claims, 13 Drawing Sheets

(56) References Cited

OTHER PUBLICATIONS

Gramsch, Ernesto et al., "Evaluation of a Junction Termination Extension Avalanche Photodiode for X-Ray Detection," IEEE Transactions on Electron Devices, vol. 54, No. 10, Oct. 2007, pp. 2638-2643.
Krizaj, D. et al., "Investigation of Efficient Termination Structure for Improved Breakdown Properties of Semiconductor Radiation Detectors," 1997 IEEE Nuclear Science Symposium Conference Record, vol. 1, pp. 521-524.
Norlin, P. et al., "Evaluation of junction termination for silicon X-ray detectors," Nuclear Instruments and Methods in Physics Research A 648 (2011), pp. S68-S71.
Pelligrini, G. et al., "Recent technological developments on LGAD and iLGAD detectors for tracking and timing applications," Nuclear Instruments and Methods in Physics Research A 831 (2016), pp. 24-28.
Witten Opinion of the International Searching Authority for Application No. PCT/SE2018/050320, dated May 30, 2018.

\* cited by examiner

X-RAY SENSOR, X-RAY DETECTOR SYSTEM AND X-RAY IMAGING SYSTEM

TECHNICAL FIELD

The proposed technology generally relates to x-ray applications such as x-ray imaging, and more particularly to an x-ray sensor, also referred to as an x-ray detector, and a corresponding x-ray detector system as well as an x-ray imaging system.

BACKGROUND

Radiographic imaging such as x-ray imaging has been used for years in medical applications and for non-destructive testing.

Normally, an x-ray imaging system includes an x-ray source and an x-ray detector system. The x-ray source emits x-rays, which pass through a subject or object to be imaged and are then registered by the x-ray detector system. Since some materials absorb a larger fraction of the x-rays than others, an image is formed of the subject or object. The x-ray detector may be of different types, including energy-integrating detectors and photon-counting detectors.

A traditional x-ray detector design normally includes, on the top side, an active detector area covered by detector diodes (pixels), e.g. in the form of strips or rectangular or hexagonal areas p-type doped in the case the substrate is a n-type high resistivity material. The top side also includes a so-called junction termination area including a so-called guard.

For maximum sensitivity the highly resistive n-type part of the detector that builds a so called drift region of the PiN diode structure must be totally depleted of charge. This requires applying a voltage of at least 400 Volts for a 500-550 μm thick n-type region without reaching a condition of junction breakdown at the position of the maximum electric field in the structure. Furthermore, the detector must sustain significantly higher voltage to secure tolerance to the positive surface charge which is created as a result of irradiation in the passivating oxide. This is known to increase the electric field at the surface and reduce the breakdown voltage. The function of the junction termination is to spread the electric field along the surface of the detector in order to reduce the electric field strength and to secure the tolerance to the positive oxide charge and long enough lifetime of the detector under irradiation.

There are two main concepts of the junction termination that are applied to PiN diodes and detectors. One is Multiple Floating Field Rings (MFFR) and the second is so called Junction Termination Extension (JTE). The MFFR uses the principle of dividing the applied reverse voltage into small fractions contained in the spaces between the floating rings surrounding the anode (p+ pixels covered area) and the JTE uses the principle of charge neutrality between the dopant charge in the JTE under depletion (negatively charged acceptors) and in the n-type drift region also under depletion (positively charged donors). A characteristic of both techniques is that they use a large area. The very principle of the field reduction is to widen the depletion region width at the surface as compared to that in the bulk of the material. For the required voltages of 400V to 800V the width of the junction termination is between 100 μm and 500 μm including the guard. The floating rings are normally equipped with metal plates helping to avoid the potential crowding at the edges of the pixel diodes. The JTE does not allow or require any metal plates and is normally more space efficient.

The guard is the outermost electrode contacting the outermost p-type doped ring with a function to collect the leakage current from the areas outside of the detector and towards the detector edge. This electrode is normally connected to the ground.

The drawback of the termination is the loss of the active detector area. Also, since many detectors are combined to cover larger area the lost area in each individual detector constitutes "dead" or blind areas in the detector matrix which has a negative influence on the quality of the obtained image.

U.S. Pat. No. 4,377,816 relates to a semiconductor element having at least one p-n junction and provided with zone guard rings for improving the suppression behavior of the p-n junction. The zone guard ring substantially acts as a so called channel stopper (field stop) to prevent the space charge region (electric field) from reaching the edge of the device and thus prevent leakage of current. This represents a simple planar diode without any junction termination and with the only protection of preventing the electric filed from reaching the side wall surface of the device.

U.S. Pat. No. 8,093,624 relates to an avalanche photodiode having a device structure that enables a fill-factor approaching 100% at visible and near-infrared wavelengths, eliminating the need for optical focusing techniques. There is provided an n-type active region and a p-type active region. A first one of the n-type and p-type active regions is disposed in a semiconductor substrate at a first substrate surface. A second one of the n-type and p-type active regions includes a high-field zone disposed beneath the first one of the active regions at a first depth in the substrate, a mid-field zone disposed laterally outward of the first active region at a second depth in the substrate greater than the first depth, and a step zone connecting the high-field zone and the mid-field zone in the substrate. With this configuration, the photodiode structure prevents non-avalanche photoelectron collection by substantially inhibiting photoelectron paths that circumvent the high-field avalanche region of the device. Conventional channel stop regions, provided as p+ regions, are located at the edges of the photodiode. The photodiode may also include a conventional guard ring structure at the periphery of the cathode, laterally surrounding the photodiode cathode, e.g., in a circular configuration. The avalanche photodiode operates at avalanche condition (breakdown) at low voltage, and the issue of terminating the entire array of pixel diodes is not addressed. U.S. Pat. No. 8,093,624 rather concerns the design and configuration of individual photodiodes, where channel stoppers are used to separate individual pixel diodes.

U.S. Pat. No. 9,087,755 relates to an avalanche photodiode that includes an anode and a cathode formed on a semiconductor substrate, where a vertical electrode with limited extension is in operative electrical communication with a buried component of the photodiode. The idea is to replace lateral conventional field plates and guard rings between individual pixel diodes in an array by vertical guard rings or field plates. Isolation between individual pixels is done using trench etching, and the vertical guard or field plate electrodes are deposited/formed using the sidewalls of the trench structure.

The detector is designed for low voltages since they do not contain junction termination in the form of floating rings or JTE, and the vertical guards or field plates are used to protect individual pixel diodes.

SUMMARY

In general, it is an object to provide an improved x-ray sensor, sometimes also referred to as an x-ray detector.

In particular, it is desirable to provide an x-ray sensor with no loss of the active detector area at the top side of the sensor for the junction termination structure(s).

It is also an object to provide an x-ray detector system comprising such an x-ray sensor.

Another object is to provide an x-ray imaging system comprising such an x-ray detector system.

These and other objects are met by embodiments of the present invention.

A basic idea of the invention is to move the junction termination to the backside of the detector. The invention thereby allows utilization of the whole top detector area as an active detector area.

Accordingly, there is provided an x-ray sensor comprising an active detector region including a plurality of detector diodes at a first side of the sensor and a common junction termination at a second opposite side of the sensor.

As mentioned, this normally implies that the junction termination is moved from the top side where the active detector area is located to the back side of the sensor, allowing for full utilization of the active detector area at the top side with detector diodes to the very edge of the sensor.

According to another aspect, there is provided an x-ray detector system comprising such an x-ray sensor.

According to yet another aspect, there is provided an x-ray imaging system comprising an x-ray detector system.

Other advantages will be appreciated when reading the detailed description.

BRIEF DESCRIPTION OF THE DRAWINGS

The embodiments, together with further objects and advantages thereof, may best be understood by making reference to the following description taken together with the accompanying drawings, in which.

DETAILED DESCRIPTION

Figure 1:
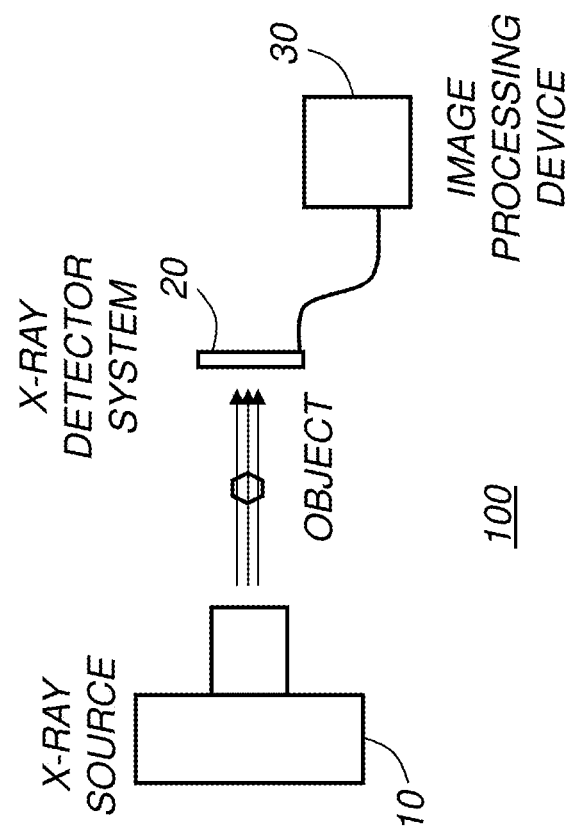
FIG. 1 is a schematic diagram illustrating an example of an overall x-ray imaging system.

It may be useful to begin with a brief overview of an illustrative overall x-ray imaging system, with reference to FIG. 1. In this non-limiting example, the x-ray imaging system 100 basically comprises an x-ray source 10, an x-ray detector system 20 and an associated image processing device 30. In general, the x-ray detector system 20 is configured for registering radiation from the x-ray source 10 that may have been focused by optional x-ray optics and passed an object or subject or part thereof. The x-ray detector system 20 is connectable to the image processing device 30 via suitable analog processing and read-out electronics (which may be integrated in the x-ray detector system 20) to enable image processing and/or image reconstruction by the image processing device 30.

Figure 2:
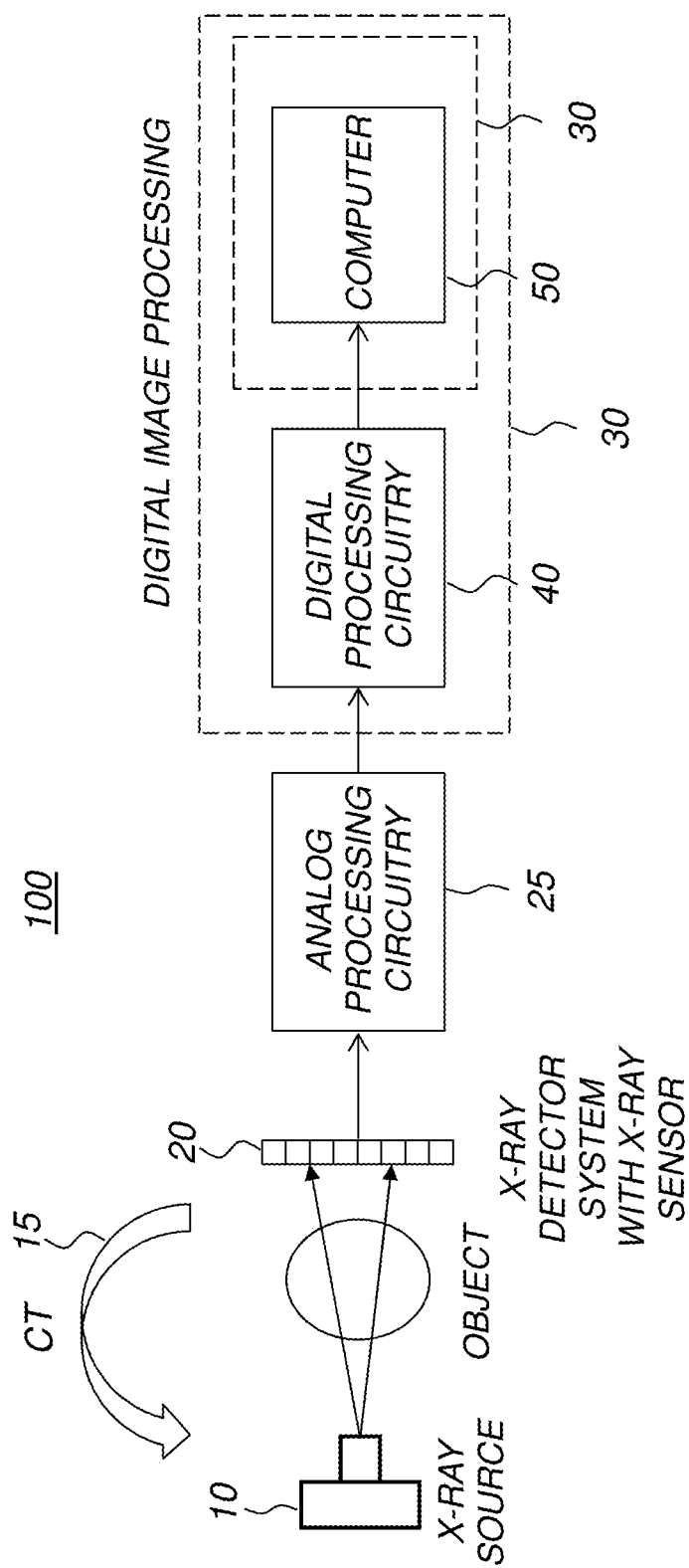
FIG. 2 is a schematic diagram illustrating another example of an x-ray imaging system.

As illustrated in FIG. 2, another example of an x-ray imaging system 100 comprises an x-ray source 10, which emits x-rays; an x-ray detector system 20, which detects the x-rays after they have passed through the object; analog processing circuitry 25, which processes the raw electrical signal from the detector and digitizes it; digital processing circuitry 40 which may carry out further processing operations on the measured data such as applying corrections, storing it temporarily, or filtering; and a computer 50 which stores the processed data and may perform further post-processing and/or image reconstruction.

The overall detector may be regarded as the x-ray detector system 20, or the x-ray detector system 20 combined with the associated analog processing circuitry 25.

The digital part including the digital processing circuitry 40 and/or the computer 50 may be regarded as a digital image processing system 30, which performs image reconstruction based on the image data from the x-ray detector. The image processing system 30 may thus be seen as the computer 50, or alternatively the combined system of the digital processing circuitry 40 and the computer 50, or possibly the digital processing circuitry 40 by itself if the digital processing circuitry is further specialized also for image processing and/or reconstruction.

An example of a commonly used x-ray imaging system is a Computed Tomography (CT) system, which may include an x-ray source that produces a fan or cone beam of x-rays and an opposing x-ray detector system for registering the fraction of x-rays that are transmitted through a patient or object. The x-ray source and detector system are normally mounted in a gantry that rotates around the imaged object.

Accordingly, the x-ray source 10 and the x-ray detector system 20 illustrated in FIG. 2 may thus be arranged as part of a CT system, e.g. mountable in a CT gantry.

Modern x-ray detectors normally need to convert the incident x-rays into electrons, this typically takes place through photo absorption or through Compton interaction and the resulting electrons are usually creating secondary visible light until its energy is lost and this light is in turn detected by a photo-sensitive material. There are also detectors, which are based on semiconductors and in this case the electrons created by the x-ray are creating electric charge in terms of electron-hole pairs which are collected through an applied electric field.

Conventional x-ray detectors are energy integrating, the contribution from each detected photon to the detected signal is therefore proportional to its energy, and in conventional CT, measurements are acquired for a single energy distribution. The images produced by a conventional CT system therefore have a certain look, where different tissues and materials show typical values in certain ranges.

Photon counting detectors have also emerged as a feasible alternative in some applications; currently those detectors are commercially available mainly in mammography. The photon counting detectors have an advantage since in principle the energy for each x-ray can be measured which yields additional information about the composition of the object. This information can be used to increase the image quality and/or to decrease the radiation dose.

Compared to the energy-integrating systems, photon-counting CT has the following advantages. Firstly, electronic noise that is integrated into the signal by the energy-integrating detectors can be rejected by setting the lowest energy threshold above the noise floor in the photon-counting detectors. Secondly, energy information can be extracted by the detector, which allows improving contrast-to-noise ratio by optimal energy weighting and which also allows so-called material basis decomposition, by which different materials and/or components in the examined subject or object can be identified and quantified, to be implemented effectively. Thirdly, more than two basis materials can be used which benefits decomposition techniques, such as K-edge imaging whereby distribution of contrast agents, e.g. iodine or gadolinium, are quantitatively determined. Fourth, there is no detector afterglow, meaning that high angular resolution can be obtained. Last but not least, higher spatial resolution can be achieved by using smaller pixel size.

The most promising materials for photon-counting x-ray detectors are cadmium telluride (CdTe), cadmium zinc telluride (CZT) and silicon (Si). CdTe and CZT are employed in several photon-counting spectral CT projects for the high absorption efficiency of high-energy x-rays used in clinical CT. However, these projects are slowly progressing due to several drawbacks of CdTe/CZT. CdTe/CZT have low charge carrier mobility, which causes severe pulse pileup at flux rates ten times lower than those encountered in clinical practice. One way to alleviate this problem is to decrease the pixel size, whereas it leads to increased spectrum distortion as a result of charge sharing and K-escape. Also, CdTe/CZT suffer from charge trapping, which would lead to polarization that causes a rapid drop of the output count rate when the photon flux reaches above a certain level.

In contrast, silicon has higher charge carrier mobility and is free from the problem of polarization. The mature manufacturing process and comparably low cost are also its advantages. But silicon has limitations that CdTe/CZT does not have. Silicon sensors must accordingly be quite thick to compensate for its low stopping power. Typically, a silicon sensor needs a thickness of several centimeters to absorb most of the incident photons, whereas CdTe/CZT needs only several millimeters. On the other hand, the long attenuation path of silicon also makes it possible to divide the detector into different depth segments, as will be explained below. This in turn makes it possible for a silicon-based photon-counting detector to properly handle the high fluxes in CT.

When using simple semiconductor materials, such as silicon or germanium, Compton scattering causes many x-ray photons to convert from a high energy to a low energy before conversion to electron-hole pairs in the detector. This results in a large fraction of the x-ray photons, originally at a higher energy, producing much less electron-hole pairs than expected, which in turn results in a substantial part of the photon flux appearing at the low end of the energy distribution. In order to detect as many of the x-ray photons as possible, it is therefore necessary to detect as low energies as possible.

A traditional x-ray sensor/detector design normally includes, on the top side, an active detector area covered by detector diodes (pixels), e.g. in the form of strips or rectangular or hexagonal areas p-type doped in the case the substrate is a n-type high resistivity material. According to the predominant trend in x-ray sensor/detector design, the top side also includes a so-called junction termination area. As mentioned, the inventors have recognized that a drawback of the termination is the loss of active detector area.

A basic idea of the invention is to move the junction termination to the bottom side of the detector. The invention thereby allows utilization of the whole top detector area as an active detector area.

The term "top side" may be used interchangeably with the term "upper side", and the term "bottom side" may be used interchangeably with the terms "back side" or "lower side". More generally, however, the terms "first side" and "second side" will be used.

Figure 3:
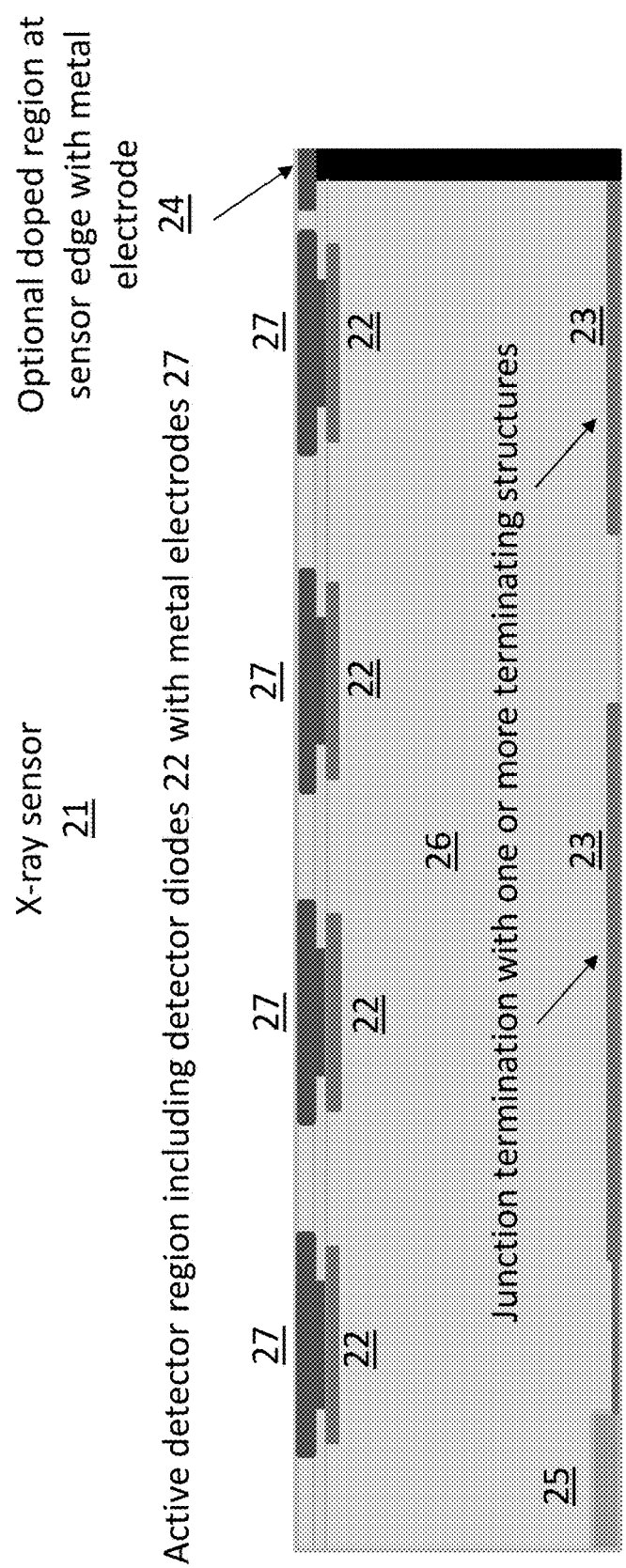
FIG. 3 is a schematic diagram illustrating a basic example of an x-ray sensor according to an embodiment.

FIG. 3 is a schematic diagram illustrating a basic example of an x-ray sensor according to an embodiment.

In this example, the x-ray sensor 21 has an active detector region including a plurality of detector diodes 22 with metal electrodes 27 at a first side of the sensor, and with placement of the junction termination 23 at a second opposite side of the sensor.

As a first example, the first side corresponds to an anode side of the sensor and the second side with the junction termination corresponds to a cathode side of the sensor.

Alternatively, as a second example, the first side corresponds to a cathode side of the sensor and the second side with the junction termination corresponds to an anode side of the sensor.

Starting with various embodiments based on the first example:

By way of example, the x-ray sensor 21 may have a cathode region 25 and the junction termination 23 may include a first terminating structure in the vicinity of the cathode region being of the same doping type as the cathode region.

For example, the junction termination 23 may include a second terminating structure of the opposite doping type in the vicinity of the sensor edge.

In a particular example, the cathode region is n+, and the first terminating structure in the vicinity of the cathode region is n-type and the second terminating structure of the opposite doping type in the vicinity of the sensor edge is p-type.

In this example, the detector diodes 22 are typically p+ diodes. The drift region 26 is normally intrinsic (low doped or not doped).

As an example, the first terminating structure is a n-type Junction Termination Extension, JTE, and the second terminating structure is p-type a Junction Termination Extension, JTE, and/or at least one p-type floating ring equipped with field plate termination.

Optionally, a region 24 of the sensor extending along the side from the first side of the sensor 21 to the second opposite side of the sensor 21 and extending around the periphery of the active detector area is p-type doped.

Continuing with various embodiments based on the second example:

By way of example, the x-ray sensor 21 may have an anode region 25 and the junction termination 23 may include a first terminating structure in the vicinity of the anode region being of the same doping type as the anode region.

For example, the junction termination 23 may include a second terminating structure of the opposite doping type in the vicinity of the sensor edge.

In a particular example, the anode region is p+, and the first terminating structure in the vicinity of the anode region is p-type and the second terminating structure of the opposite doping type in the vicinity of the sensor edge is n-type.

In this example, the detector diodes 22 are typically n+ diodes. The drift region is normally intrinsic (low doped or not doped).

As an example, the first terminating structure is a p-type Junction Termination Extension, JTE, and the second terminating structure is n-type a Junction Termination Extension, JTE, and/or at least one n-type floating ring equipped with field plate termination.

Optionally, a region 24 of the sensor extending along the side from the first side of the sensor 21 to the second opposite side of the sensor 21 and extending around the periphery of the active detector area is n-type doped.

More generally, for any x-ray sensor with the active detector region located at a first side of the sensor and with placement of the junction termination at a second opposite side of the sensor, a doped region 24 may optionally be provided at the sensor edge as illustrated in FIG. 3. This region 24 may also be referred to as a side edge adjacent doped region, and the doped region 24 typically extends around the entire periphery of the sensor.

For example, there may be provided a region 24 of the sensor extending along the side from the first side of the sensor 21 to the second opposite side of the sensor 21 and extending around the periphery of the active detector area, which edge region is doped to provide a p-n junction isolation from the side edge surface of the sensor. The doped region 24 may also distribute/transfer the potential and electric field from the top side to the bottom side.

By way of example, the doped region 24 may additionally be connected with a guard electrode at the first side of the sensor 21 to provide a guard structure. Since the doped region extends between the top side and the bottom side, this guard structure is sometimes referred to as a vertical guard structure or vertical guard ring.

In general, the junction termination may include any suitable type of junction termination structures such as a Junction Termination Extension, JTE, and/or one or more Floating Field Rings, FFR.

As described herein, the active detector region or area may include an array of detector diodes 21 and the junction termination may be configured for terminating the entire array of detector diodes.

According to another aspect, the doped region at the side edge of the sensor may be implemented independently of the feature of arranging the junction termination on the bottom side of the sensor. In this case, there is provided an x-ray sensor 21 having an active detector region including a plurality of detector diodes 22, wherein a region 24 of the sensor extending along the entire side edge of the sensor 21 and extending around the periphery of the active detector area is doped to provide a p-n junction isolation from the side edge surface of the sensor and/or wherein the doped region 24 is provided with a guard electrode at the first side of the sensor to provide a guard structure.

According to yet another aspect, there is also provided an x-ray detector system 20 comprising an x-ray sensor 21 as described herein.

According to still another aspect, there is also provided an x-ray imaging system 100 comprising an x-ray detector system 20 as described herein.

For improved understanding of the proposed technology, reference can be made to the following non-limiting example implementations.

In the case of a preferred embodiment the obtainable blocking voltage can be adjusted by proper design of the terminations at the bottom side of the detector and independently of the detector top side design.

Figure 5:
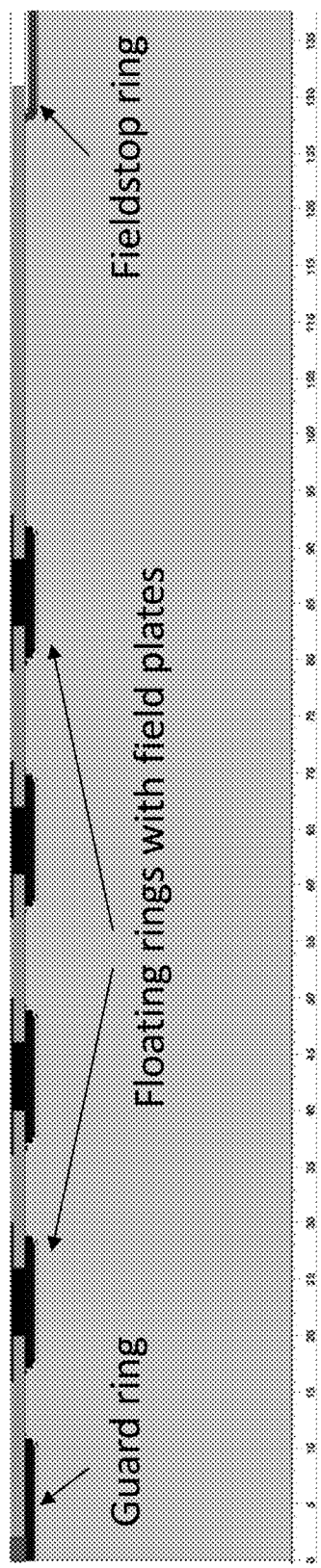
FIG. 5 is a schematic diagram illustrating a cross-section of an example of the top side of a standard x-ray sensor including a junction termination structure.

FIG. 5 is a schematic diagram illustrating a cross-section of an example of the top side of a standard x-ray sensor including a junction termination structure.

In the example of FIG. 5, the top side of a standard detector is illustrated with a junction termination structure having 4 floating rings (FR) equipped with field plates (only termination structure is shown). A standard termination can contain up to twenty FR rings.

Figure 6:
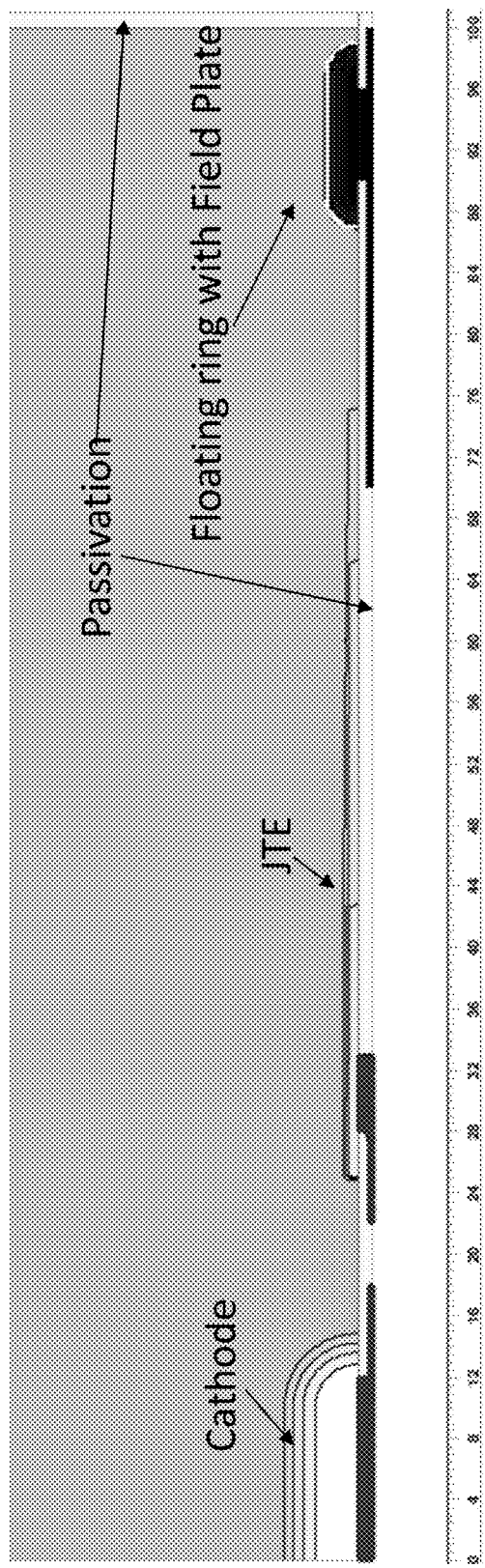
FIG. 6 is a schematic diagram illustrating a cross-section of an example of an x-ray sensor with the junction termination at the back side of the sensor and oxide passivation of the sensor edge.

FIG. 6 is a schematic diagram illustrating a cross-section of an example of an x-ray sensor with the junction termination at the back side of the sensor and oxide passivation of the sensor edge.

It is possible to provide an example implementation with a n-type JTE close to the cathode region and additional floating ring equipped with field plate termination close to the detector edge.

The design illustrated in FIG. 6 is referred to as Embodiment A.

Figure 7:
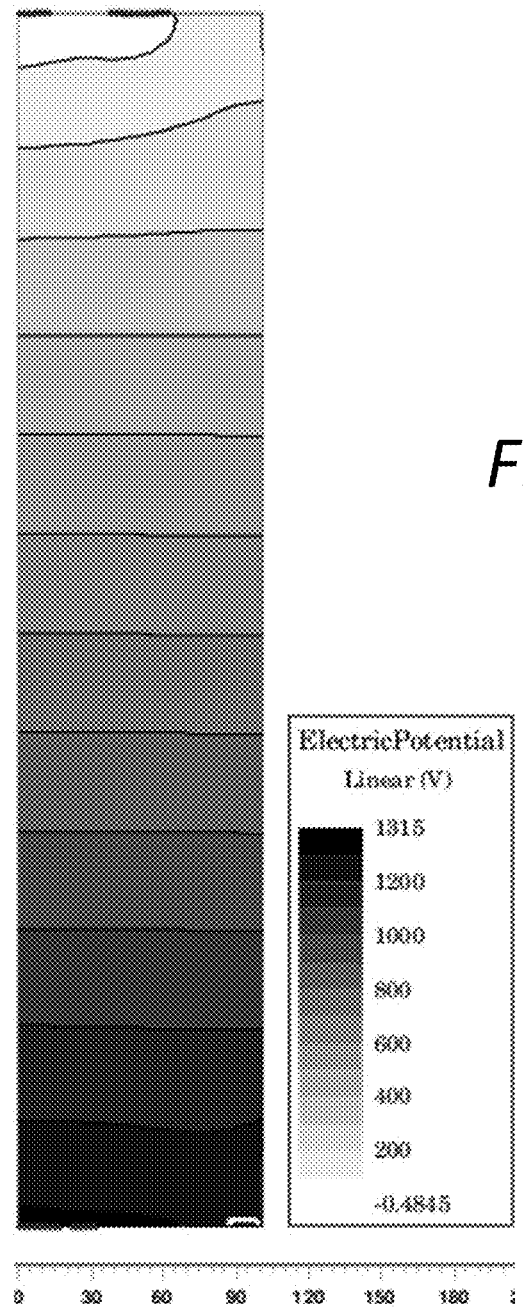
FIG. 7 is a schematic diagram illustrating the electric potential of different parts of the x-ray sensor of FIG. 6.

FIG. 7 is a schematic diagram illustrating the electric potential of different parts of the x-ray sensor of FIG. 6.

Figure 8:
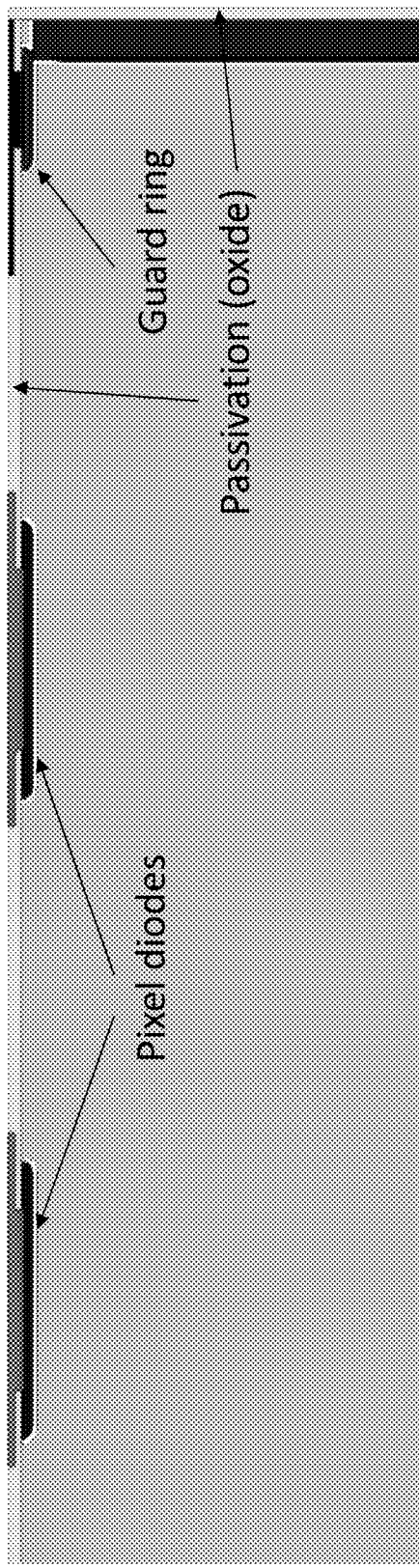
FIG. 8 is a schematic diagram illustrating a cross-section of an example of the top side of an x-ray sensor with a doped edge constituting a sensor guard structure.

FIG. 8 is a schematic diagram illustrating a cross-section of an example of the top side of an x-ray sensor with a doped edge constituting a sensor guard structure.

By way of example, the sensor edge may be p-type doped by implantation and/or diffusion and thereby constitutes a sensor guard or detector guard.

In a particular example, p-doping is introduced at the sensor edge and connected to a guard electrode on the top (anode) side of the sensor or detector.

A combination of the design illustrated in FIG. 6 and FIG. 8 is possible and referred to as Embodiment B.

Figure 9:
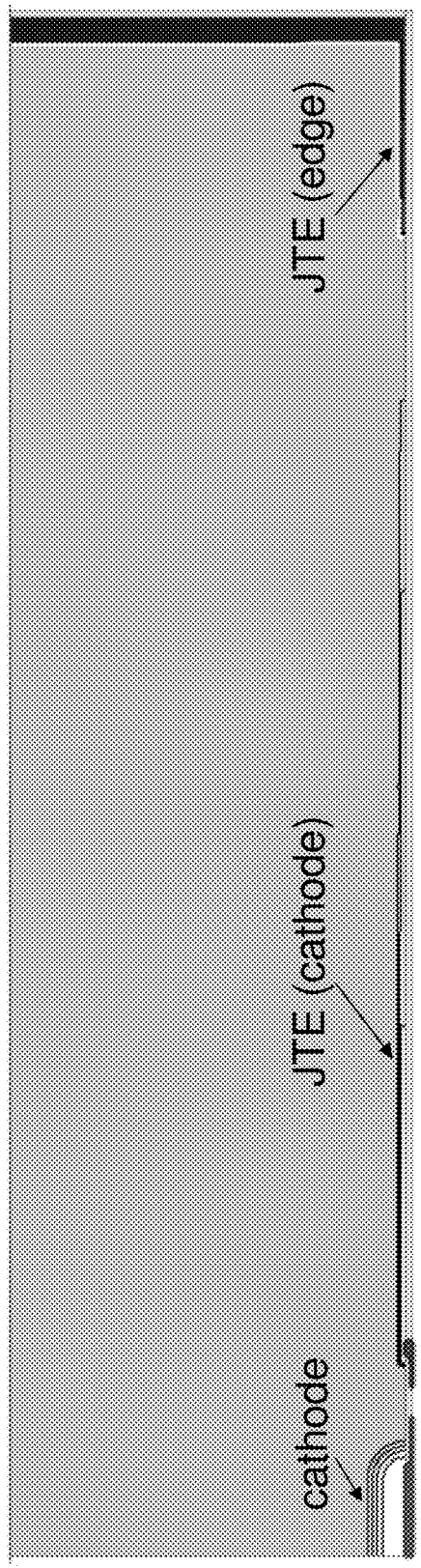
FIG. 9 is a schematic diagram illustrating a cross-section of an example of the bottom side of an x-ray sensor with a JTE in connection with the cathode and a JTE in connection with the sensor edge, which is a doped sensor edge constituting a guard structure.

FIG. 9 is a schematic diagram illustrating a cross-section of an example of the bottom side of an x-ray sensor with a JTE in connection with the cathode and a JTE in connection with the sensor edge, which is a doped sensor edge constituting a guard structure.

In a particular example, an implementation includes an n-type JTE close to the cathode region, p-type JTE termination close to the sensor or detector edge and a p-type doped sensor or detector edge which at the same time constitutes a sensor detector guard.

The design illustrated in FIG. 9 is referred to as Embodiment C (a).

Figure 10:
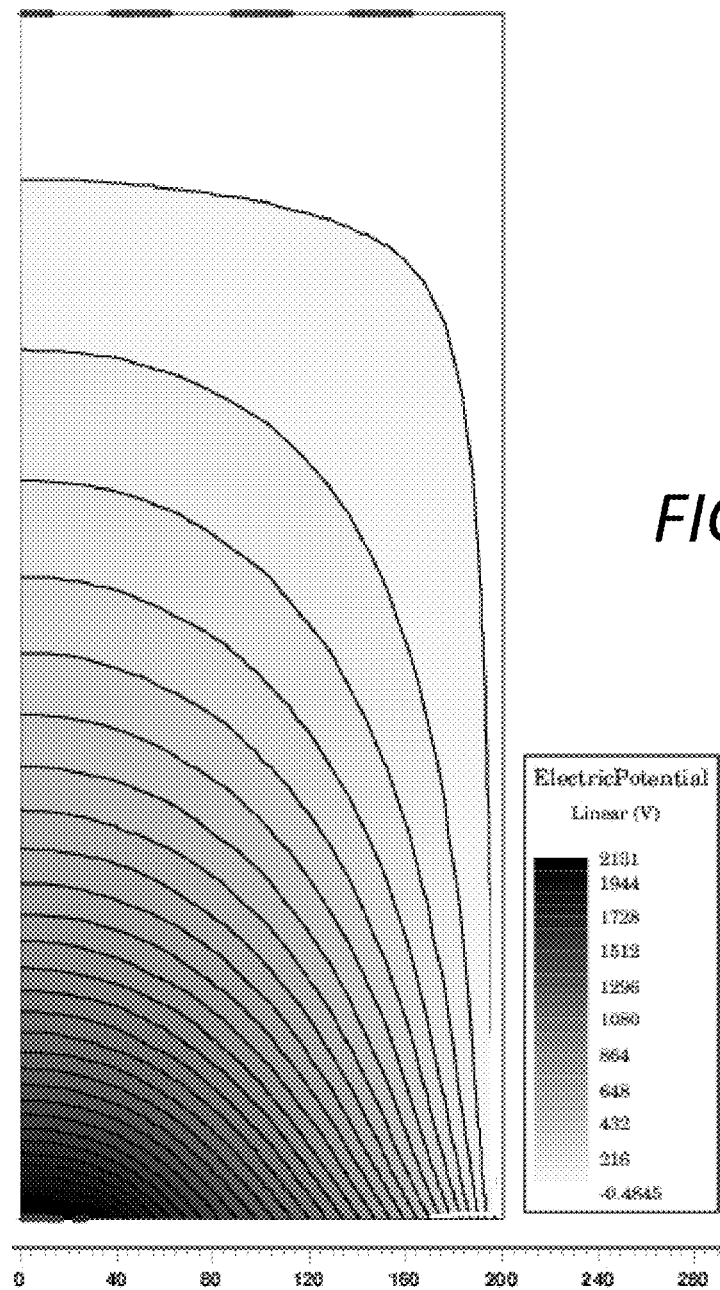
FIG. 10 is a schematic diagram illustrating the electric potential of different parts of the x-ray sensor of FIG. 9.

FIG. 10 is a schematic diagram illustrating the electric potential of different parts of the x-ray sensor of FIG. 9.

Figure 11:
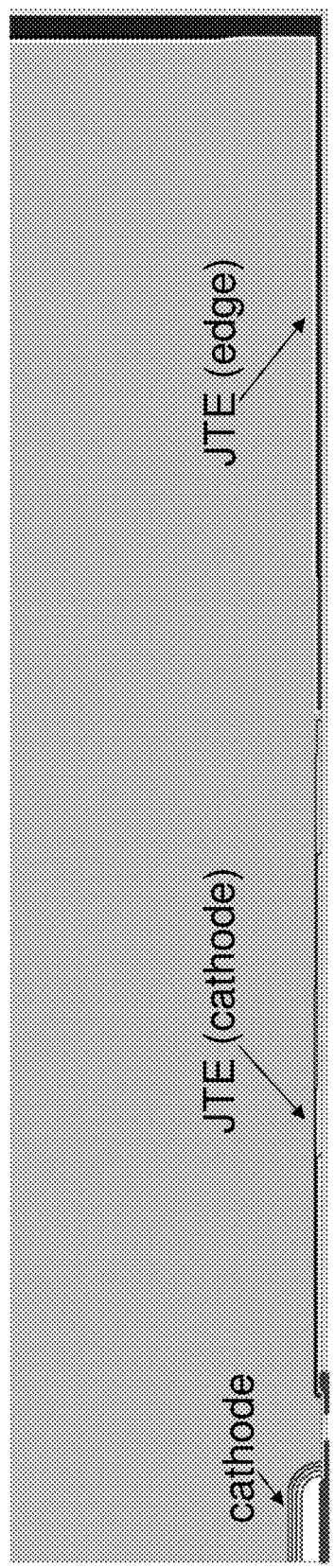
FIG. 11 is a schematic diagram illustrating a cross-section of another example of the bottom side of an x-ray sensor with a JTE in connection with the cathode and a JTE in connection with the sensor edge, which is a doped sensor edge constituting a guard structure.

FIG. 11 is a schematic diagram illustrating a cross-section of another example of the bottom side of an x-ray sensor with a JTE in connection with the cathode and a JTE in connection with the sensor edge, which is a doped sensor edge constituting a guard structure.

The design illustrated in FIG. 9 is referred to as Embodiment C (b) and illustrates the optimization possibilities of Embodiment C.

Figure 12:
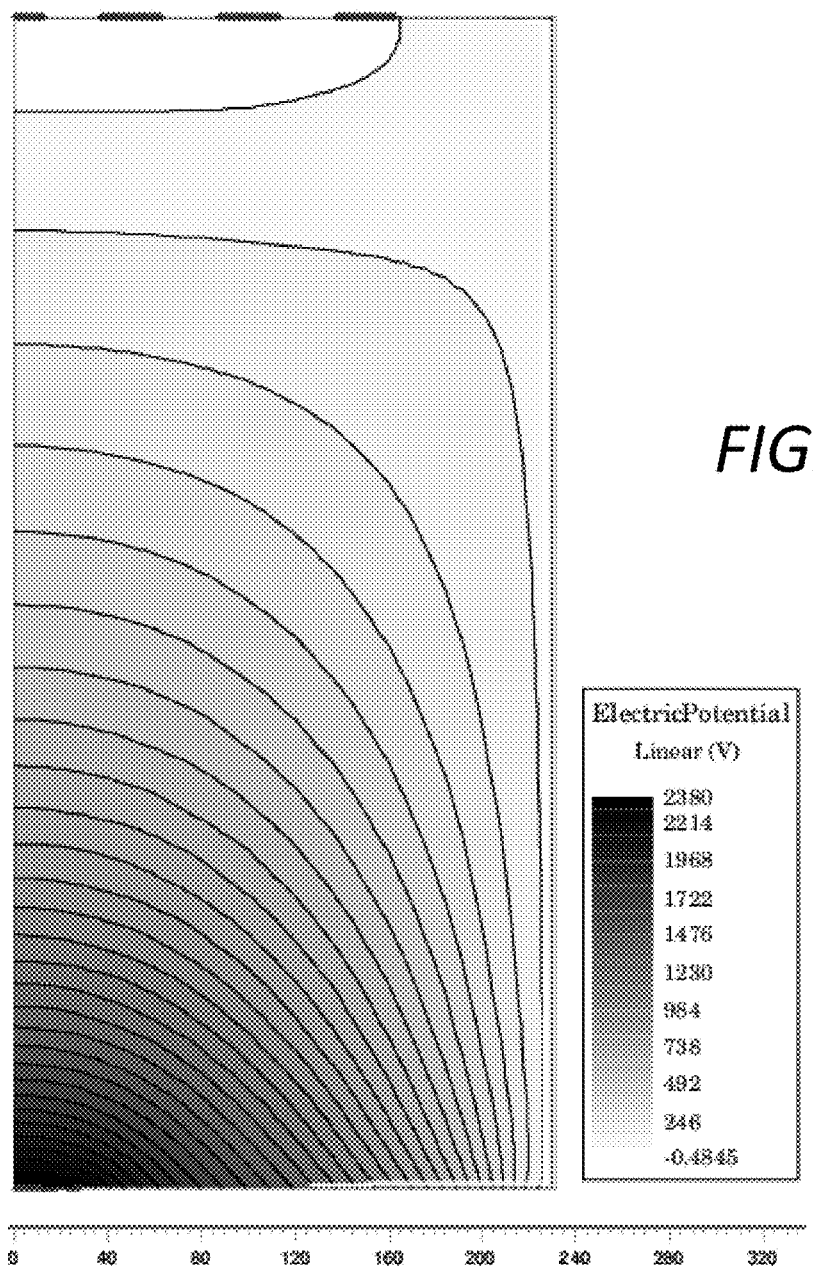
FIG. 12 is a schematic diagram illustrating the electric potential of different parts of the x-ray sensor of FIG. 11.

FIG. 12 is a schematic diagram illustrating the electric potential of different parts of the x-ray sensor of FIG. 11.

The breakdown/blocking voltage and sensitivity to the surface charge can be optimized by the design of the n-type and p-type JTE independently of the top side detector design, as can be appreciated, e.g. from the two slightly different implementations shown in FIG. 9 and FIG. 11.

Figure 13:
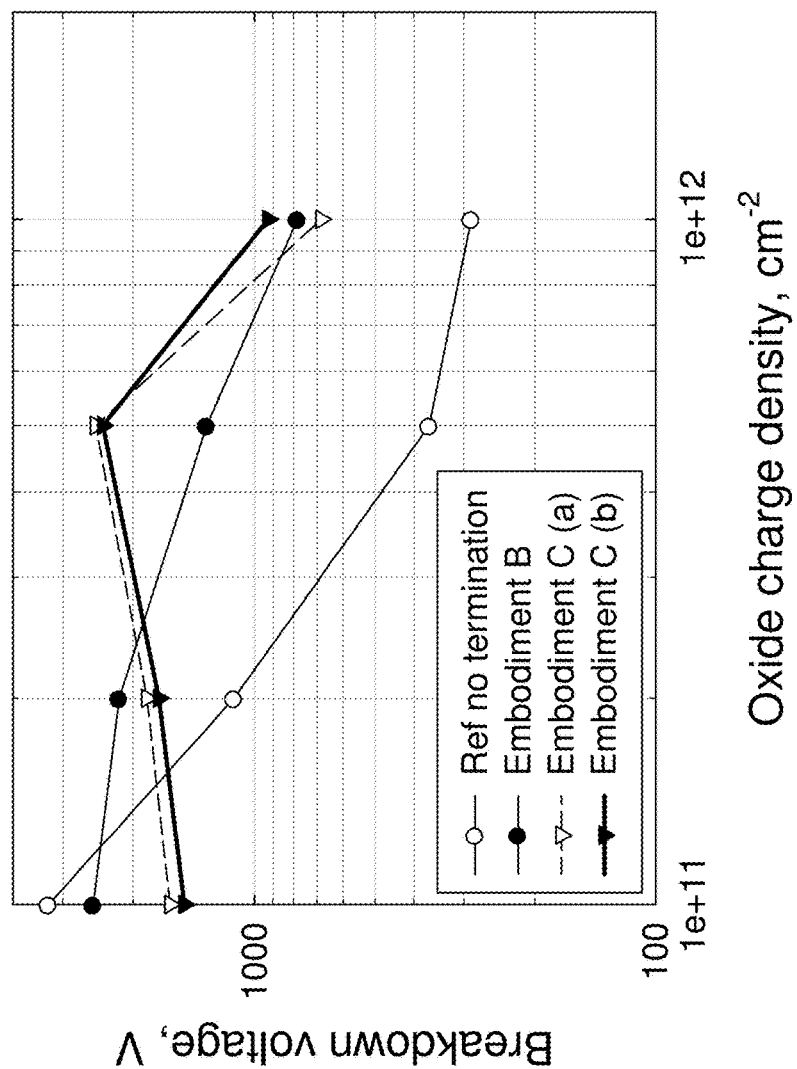
FIG. 13 is a schematic diagram illustrating the obtained breakdown or blocking voltage values for different embodiments in comparison to an unterminated reference structure.

FIG. 13 is a schematic diagram illustrating the obtained breakdown or blocking voltage values for different embodiments in comparison to an unterminated reference structure.

More particularly, FIG. 13 illustrates the breakdown voltage versus concentration of the positive surface charge at the oxide covered surfaces of the detector. Note that two curves are shown for embodiment C for the two designs of the bottom side JTE (C(a) and C(b)) shown in FIG. 9 and FIG. 11, respectively. The reference structure is an unterminated structure. The unterminated structure is oxide passivated on all surfaces assuming an ideal oxide/semiconductor interface of the same quality on the top and bottom surfaces and on the edge surface of the sensor.

It is acknowledged here that the quality of the edge surface is unlikely to be as good as that of the top surface due to the dicing process necessary to cut individual sensors out of the mother wafer after processing. The edge of the individual sensors is prone to have high concentration of defects generating leakage current and charge trapping effects.

Figure 4:
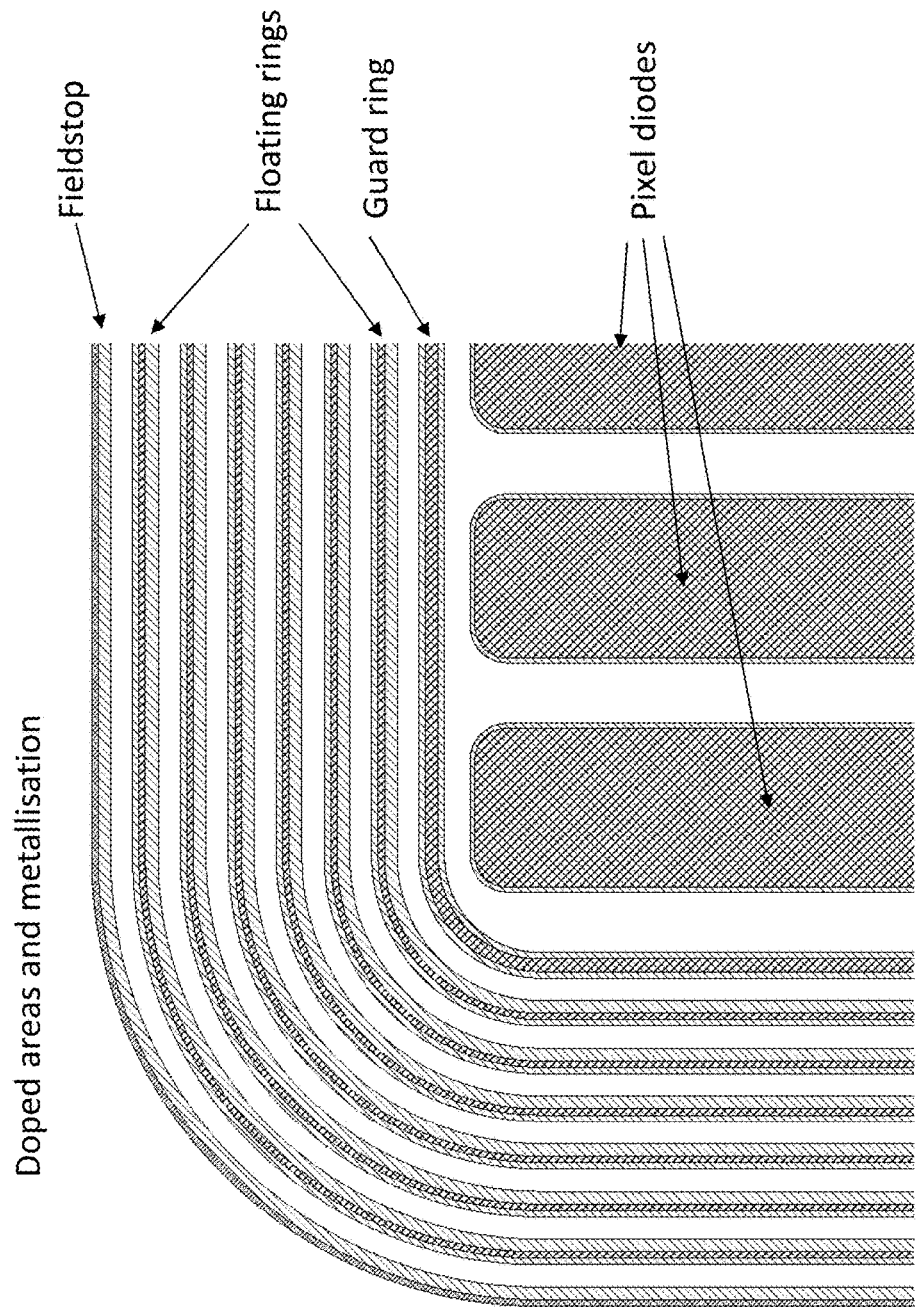
FIG. 4 is a schematic diagram illustrating an example of an x-ray sensor seen from above (top view) according to an embodiment.

This is the main reason for the Embodiment C being the preferred embodiment of the invention. The objective of the high voltage sensor termination and of the guard is the protection of the anode pixel diodes. In a traditional sensor design of FIG. 4 the function of the guard ring and that of the floating rings or JTE termination are typically distinctly different and separated. The function of the floating rings and of the JTE is to control the electric field at the device periphery and at the surface. Normally, the function of the guard ring is entirely to collect the leakage current generated at the periphery of the sensor (being an array of pixel diodes). According to the preferred embodiment of the invention these two functions are integrated in the sense that the guard is an integral part of the high voltage termination. The distinct advantages provided by the solution are full utilization of the top surface for x-ray detection and efficient isolation of the entire edge surface. At reverse bias the electric field is transferred to the back side or bottom side by use of a p-doping at the edge of the sensor. This p-doping forming a p-n junction with the low doped drift region of the sensor is then at the same time used as a guard of the sensor. Furthermore, the p-n junction between the p-doped edge region of the sensor with the low doped drift region (n-type) isolates the entire leakage generating imperfect surface of the sensor from the active volume of the device with high electric field (drift region). The conduction types can of course be reversed.

By way of example, the guard extends all the way to the cathode side (back side; bottom side). The high voltage termination of the sensor and electric field control is done first at the back side in the space between the cathode region and the guard junction. It is desirable to do this by distributing the electric field as evenly as possible in that space by the means of proper design of the junction terminations (JTE). For the best result both termination of the guard junction and of the cathode region is needed.

In a particular example, the high voltage termination is moved to the back side and the pixel diodes are arranged to the very edge of the sensor. For this reason, it is desirable to provide isolation of the surface by the p-n junction formed by the p-type doping over the full length of the side wall of the sensor. The p-region is then used as a guard (as an extra feature) by providing an electrode at the top surface connecting to it. This is done to provide an alternative path for the current from the edge area alternatively to control the potential leakage current.

By way of example, the cathode and anode side of the sensor/detector may be formed in planar technology. JTE terminations and guard contact area may for example be done by implantation prior to reactive ion etching alternative dicing. Sensor side wall doping may be performed by angular implantation after attaching the sensors/detectors to the carrier wafers and protecting the top surface. As an example, low temperature activation of dopants may be done after detachment of sensors/detectors from the carriers.

For all embodiments shown and discussed herein, the conductivity types of the involved elements/regions can be reversed, while switching places of the cathode and anode. Normally, the cathode is n-type (n+) and the anode is p-type (p+).

It will be appreciated that the mechanisms and arrangements described herein can be implemented, combined and re-arranged in a variety of ways.

The embodiments described above are merely given as examples, and it should be understood that the proposed technology is not limited thereto. It will be understood by those skilled in the art that various modifications, combinations and changes may be made to the embodiments without departing from the present scope as defined by the appended claims. In particular, different part solutions in the different embodiments can be combined in other configurations, where technically possible.

The invention claimed is:

1. An x-ray sensor comprising:
an active detector region including a plurality of detector diodes at a first side of the sensor; and
a common junction termination at a second opposite side of the sensor,
wherein the first side corresponds to an anode side of the sensor and the second side with the junction termination corresponds to a cathode side of the sensor, or
wherein the first side corresponds to a cathode side of the sensor and the second side with the junction termination corresponds to an anode side of the sensor.

2. The x-ray sensor of claim 1, wherein a region of the sensor extending along the side from the first side of the sensor to the second opposite side of the sensor and extending around the periphery of the active detector area is doped to provide a p-n junction isolation from the side edge surface of the sensor.

3. The x-ray sensor of claim 2, wherein the doped region is provided with a guard electrode at the first side of the sensor to provide a guard structure.

4. The x-ray sensor of claim 1, wherein the junction termination includes a Junction Termination Extension, JTE, and/or one or more Floating Field Rings, FFR.

5. The x-ray sensor of claim 1, wherein the active detector area includes an array of detector diodes and the junction termination is configured for terminating the array of detector diodes.

6. An x-ray sensor comprising:
an active detector region including a plurality of detector diodes,
wherein a region of the sensor extending along the side edge of the sensor and extending around the periphery of the active detector area is doped to provide a p-n junction isolation from the side edge surface of the sensor and/or wherein the doped region is provided with a guard electrode at the first side of the sensor to provide a guard structure.

7. An x-ray detector system comprising an x-ray sensor of claim 1.

8. An x-ray imaging system comprising an x-ray detector system of claim 7.

* * * * *